(12) United States Patent
Rothman

(10) Patent No.: US 7,795,639 B2
(45) Date of Patent: Sep. 14, 2010

(54) AVALANCHE PHOTODIODE

(75) Inventor: Johan Rothman, Lans en Vercors (FR)

(73) Assignee: Commissariat A l'Energie Atomique, Paris (FR)

( * ) Notice: Subject to any disclaimer, the term of this patent is extended or adjusted under 35 U.S.C. 154(b) by 217 days.

(21) Appl. No.: 11/853,871

(22) Filed: Sep. 12, 2007

(65) Prior Publication Data
US 2008/0067620 A1  Mar. 20, 2008

(30) Foreign Application Priority Data
Sep. 18, 2006  (FR)  ................................... 06 53799

(51) Int. Cl.
*H01L 31/107* (2006.01)
(52) U.S. Cl. .................. 257/186; 257/184; 257/185; 257/188; 257/438; 257/441; 257/442; 257/465; 257/466; 257/E31.063
(58) Field of Classification Search ......... 257/188–189, 257/184–186, 441–442, 438, 465, 466, E31.063
See application file for complete search history.

(56) References Cited
U.S. PATENT DOCUMENTS

| | | | |
|---|---|---|---|
| 4,481,523 A | | 11/1984 | Osaka et al. |
| 5,185,648 A | | 2/1993 | Baker et al. |
| 5,552,616 A | * | 9/1996 | Kobayashi ................... 257/184 |
| 6,034,407 A | * | 3/2000 | Tennant et al. .............. 257/440 |
| 7,041,983 B2 | * | 5/2006 | Mitra ..................... 250/370.13 |

FOREIGN PATENT DOCUMENTS

JP  59149070 A  *  8/1984

OTHER PUBLICATIONS

Rutkowski, J., "Planar junction formation in HgCdTe infrared detectors", Opto-Electrics Review, 12, No. 1, 23-128, 2004.*
Rogalski, A., "HgCdTe infrared detector material: history, status and outlook", Rep. Prog. Phys., 68, 2267-2336, 2005.*
C.A. Musca et al., "Laser Beam Induced Current As a Tool for HgCdTe Photodiode Characterisation," Micoelectronics Journal, Mackintosh Publications Ltd. Luton, GB, vol. 31, No. 7, Jul. 30, 2000, pp. 537-544.
J. Beck et al., "The HgCdTe Electron Avalanche Photodiode," Proceedings of SPIE, vol. 5564, Aug. 4, 2004, pp. 44-53.

* cited by examiner

*Primary Examiner*—Jerome Jackson, Jr.
*Assistant Examiner*—Yu Chen
(74) *Attorney, Agent, or Firm*—Burr & Brown

(57) ABSTRACT

A photodiode designed to capture incident photons includes a stack of at least three superposed layers of semiconductor materials having a first conductivity type. The stack includes: an interaction layer designed to interact with incident photons so as to generate photocarriers; a collection layer to collect the photocarriers; a confinement layer designed to confine the photocarriers in the collection layer. The collection layer has a band gap less than the band gaps of the interaction layer and confinement layer. The photodiode also includes a region which extends transversely relative to the planes of the layers. The region is in contact with the collection layer and confinement layer and has a conductivity type opposite to the first conductivity type so as to form a p-n junction with the stack.

18 Claims, 4 Drawing Sheets

AVALANCHE PHOTODIODE

FIELD OF THE INVENTION

The present invention relates to a photodiode intended, by definition, to capture photons, especially when it functions in the reverse bias avalanche operating mode.

The present invention also relates to a detector comprising juxtaposed photodiodes of this type.

The present invention therefore relates to the field of opto-electronic components and detectors.

DESCRIPTION OF THE PRIOR ART

In a known manner, avalanche diodes are used in order to detect streams of incoming photons in a relatively sensitive and/or relatively fast manner, i.e., with short response times. In fact, an avalanche photodiode allows detection with amplification of photocarriers when the reverse bias is sufficient to trigger avalanche behaviour in the multiplication region.

Thus, avalanche photodiodes have various possible applications including implementing detection focal-planes for active imaging, high-speed detection in the field of telecommunications, spectroscopy, detecting very weak luminous fluxes and even photon counting.

In a known manner, reverse biasing a diode makes it possible to accelerate free charge carriers due to the effect of the electric field applied in the depletion region located between n-type doped layers and p-type doped layers. Such acceleration of the free charge carriers gives them, depending on the characteristics of the diode, sufficient energy to produce impact ionization thereby creating additional electron-hole pairs.

This produces an avalanche effect, i.e. multiplication of the number of photocarriers starting with a small number of initial photocarriers. In this case, the current detected by the photodiode is:

$$I_{DA} = M \cdot I_{CC}, \text{ where:}$$

$I_{DA}$ is the current detected by the avalanche diode;

$I_{CC}$ is the current detected by the diode with zero bias applied;

M is the gain of the diode or the multiplication factor due to the avalanche effect.

However, in most avalanche diodes according to the prior art, such amplification of small currents causes amplification of electronic noise and hence degrades the detector's signal-to-noise ratio. The mean density of the electron noise in the amplified current of an avalanche diode is:

$$i_{B\text{-}DA} = M \cdot (2 \cdot q \cdot I_{CC} \cdot F)^{1/2}, \text{ where:}$$

q is the charge of one electron;

F is the noise factor.

Noise factor F is ideally 1, i.e. the avalanche diode amplifies the current without adding noise to the signal received by the detector.

As is known, noise factor F is strongly dependent on the process of charge carrier multiplication. Consequently, it depends on the shape of the p-n junction of the diode and on the material of which the depletion region, where multiplication takes place, is made.

The noise factor is linked to the gain probability distribution for a photocarrier generated in the diode $$F = 1 + \frac{\sigma_M^2}{M^2}$$

where $\sigma_M$ and M are the standard deviation and mean deviation of the avalanche gain probability distribution.

This distribution depends on the material used and the shape of the junction. In particular, if impact ionization is produced by holes and electrons, multiplication is highly random and the noise factor is considerable (F>2). In contrast, in a material where multiplication is dominated by electrons or holes, the noise factor is small and equal to or less than 2. In this case, the noise factor depends on the process of accelerating and ionizing the carriers in the depletion region with this process being dependent on the material and the shape of the junction.

In telecommunication and laser telemetry applications where near-infrared rays are detected, the semiconductor materials used to form photodiodes are alloys of indium (In), gallium (Ga), arsenic (As) and phosphorus (P) such as InGaAs and InGaAsP. Such photodiodes, when suitably reverse biased, multiply carriers with equivalent contributions of electrons and holes. These photodiodes therefore have a high noise factor F which is typically greater than 2.

This is why photodiodes have been produced using alloys of cadmium (Cd), mercury (Hg) and tellurium (Te) having the general formula $Hg_{1-x}Cd_xTe$, where x varies from 0 to 1 and represents the fraction of cadmium in the composition of the alloy.

Materials where fraction x is approximately 0.3 and which are used to detect infrared radiation of average wavelength, produce multiplication which is essentially triggered by electrons and therefore achieve a relatively low noise factor F and relatively little degradation of the signal-to-noise ratio. Moreover, at low temperature (77 K) and with low reverse bias (less than 10 V), this multiplication results in high gains M, typically in excess of 100.

In contrast, in the case of alloys where fraction x exceeds 0.55 and which are used to detect near-infrared rays, it is the holes that dominate carrier multiplication, but only slightly, so that noise factor F is equal to or greater than 2, thus degrading the detector's signal-to-noise ratio.

Also, attempts are made to minimize the dark current which flows through an avalanche photodiode. In a known manner, the dark current contributes to degradation of the detector's signal-to-noise ratio for the smallest stream of photons that is to be measured, thus limiting the sensitivity of the detector for a given bias. Attempts are also made to increase the avalanche gain.

In order to achieve this, one solution according to the prior art involves separating the region where photocarriers multiply from the region where interactions with incident photons occur. In practice, this separation is obtained by, for example, producing a multiplication region having a band gap greater than the band gap of the interaction region.

It is also possible to add other functional regions making it possible to improve other operating parameters of the diode, for example, its gain homogeneity or to reduce its bias voltage during operation and reduce its noise factor.

Besides the choice of materials that constitute the diode and their doping, the prior art also proposes a special structure in order to reduce the dark current. With this construction, a guard ring is produced around the p-n junction at some distance from it. This guard ring makes it possible to limit the electric field concentration effects which occur in the diode.

Photodiodes according to the prior art have the common characteristic of a p-n junction produced on a surface which is substantially perpendicular to the stack of functional layers, such as the interaction layer where incident photons are absorbed. The article entitled "The HgCdTe Electron Avalanche Photodiode" which appeared in SPIE Proc. (Vol. 5564, pp. 44-53) describes such photodiodes with a "vertical" structure. The interfaces between the p-type, depletion and n-type regions that are perpendicular to the surface of the detection plane in the case of an array detector.

Gain-normalized dark currents of 0.1 $\mu A/cm^2$ to 1 $\mu A/cm^2$ flow in photodiodes according to the prior art with gains from 30 to 1000 at 77 K, with the noise factor generally being kept at around 1 where the wavelength to be detected is less than 5 $\mu m$.

This dark current limits the sensitivity of the detector. Also, the higher the operating temperature of the photodiode, the greater the dark current. Consequently, sensitivity deteriorates when the detector is operating at a high temperature.

The object of the present invention is a photodiode and a detector which do not have the disadvantages associated with the prior art.

SUMMARY OF THE INVENTION

The present invention relates to a photodiode and a detector comprising juxtaposed photodiodes having a noise factor F close to 1 and a relatively low dark current. The gain of the photodiode which is the object of the invention can be high even with low reverse bias without thereby degrading the detector's signal-to-noise ratio, especially when detecting infrared and/or visible radiation.

The object of the invention is a photodiode designed to capture incident photons comprising a stack of at least three superposed layers of semiconductor materials having a first conductivity type. The stack comprises:

an interaction layer designed to interact with photons so as to generate photocarriers;

a collection layer to collect these photocarriers;

a confinement layer designed to confine photocarriers in the collection layer.

According to the invention, the collection layer has a band gap which is less than the band gaps of the interaction and confinement layers and the photodiode also comprises a region which extends transversely relative to the planes of the layers, this region being in contact with the collection layer and the confinement layer and having a conductivity type which is opposite to the first conductivity type so as to form a p-n junction with the stack.

In other words, the structure of the photodiode according to the invention comprises layers which extend parallel to the detection plane, apart from a region which is arranged across the superposed parallel layers and reverse doped in order to form a p-n junction.

In one embodiment of the invention, said region extends partially into the interaction layer.

Advantageously, the collection layer is thinner than the interaction layer. In fact, the thinner said layer is, the weaker the dark current and the weaker interaction with interfering radiation will be.

In practice, the thickness of the collection layer can be less than 0.5 $\mu m$ whereas the thickness of the interaction layer can exceed 1 $\mu m$.

Such thicknesses allow these layers to fulfil their collection and interaction functions with compact overall dimensions and negligible sensitivity to interfering radiation.

Advantageously, the material that constitutes the interaction layer has a band-gap gradient.

In practice, the confinement layer may be covered in a first passivation layer.

Advantageously, a read contact is made so that it is in contact with the region and is designed to transfer the electrical signals produced by photocarriers to an analysis circuit.

In one particular embodiment of the invention, this region which extends transversely may extend starting from a hollow shape.

In practice, the first conductivity type is p-type. Such doping of the interaction, collection and confinement layers makes it possible to produce a high-performance photodiode.

In one particular embodiment of the invention, the interaction and collection layers may consist of an alloy of mercury, cadmium and tellurium having the formula $Hg_{1-x}Cd_xTe$. In addition, the value chosen for fraction x is between 0.1 and 0.5 for the collection layer and between 0.1 and 1 for the interaction layer.

Such an alloy makes it possible to produce a photodiode with a low noise factor and low dark current, but with considerable multiplication gain at low bias.

In another embodiment of the invention, the collection layer may comprise a stack of superposed layers made of semiconductor materials with the central layer having a band gap which is less than the band gaps of the peripheral layers so as to reduce the transition between the collection layer and the interaction and confinement layers. In other words, the collection layer is sandwiched between two insertion layers which represent a gradated transition to the interaction layer on the one hand and to the confinement layer on the other hand. This makes it possible to reduce or even prevent the occurrence of defects at the interfacial heterojunctions of the collection layer and, on this basis, to reduce the dark current and increase the resistance of the diode to reverse bias voltage.

The invention also relates to a photodiode in the form of a "mesa" or flat-topped elevation. According to the invention, this photodiode is delineated by an area which is free of material that extends depth wise over the entire height of the collection and confinement layers and over part of the height of the interaction layer, that part of the stack located in this area being covered in a second passivation layer which can be the first passivation layer.

In other words, each photodiode is individualized and forms a protrusion above a common substrate consisting of the interaction layers of all the juxtaposed photodiodes. This makes it possible to reduce the diffusion volume through which the photocarriers must pass before being collected at the p-n junction. In fact, the layers doped to obtain the first conductivity type have a shape which, overall, converges towards the layer of the opposite conductivity type. Consequently, this characteristic makes it possible to reduce the response time of such a detector as well as its dark current.

In one practical embodiment of the detector according to the invention, the second passivation layer may be covered in a metallization layer.

Such a metallization layer makes it possible, by applying an appropriate bias voltage, to accumulate charge carriers at the interface between the semiconductor materials and the passivation layer which is inherently neutral, i.e. on the flanks of the "mesas". The charge carriers thus accumulated form an electric field capable of accelerating the photocarriers towards the p-n junction even faster, and this helps reduce the detector's response time.

The invention also relates to an electromagnetic radiation detector comprising at least two juxtaposed photodiodes of this kind.

The invention also relates to a dual spectrum electromagnetic radiation detector comprising at least one photodiode, as explained above, designed to capture photons in a first energy spectrum on which there is a planar diode comprising an absorption layer designed to capture photons in a second energy spectrum as well as a p-n junction region which is connected to an electrically conducting contact, this absorption layer having a well which communicates with the region, with a passivation layer covering this absorption layer and a metallization layer covering the region and this passivation layer over part of the well, this contact and this metallization layer being capable of conducting electrical signals from the photodiode to an analysis circuit.

In addition, in one variation, the operation of such a dual spectrum detector can even be optimized by covering the face of the interaction layer which is opposite to that which receives the collection layer with an additional layer which functions as a filter.

DESCRIPTION OF THE PREFERRED EMBODIMENTS

Figure 1:
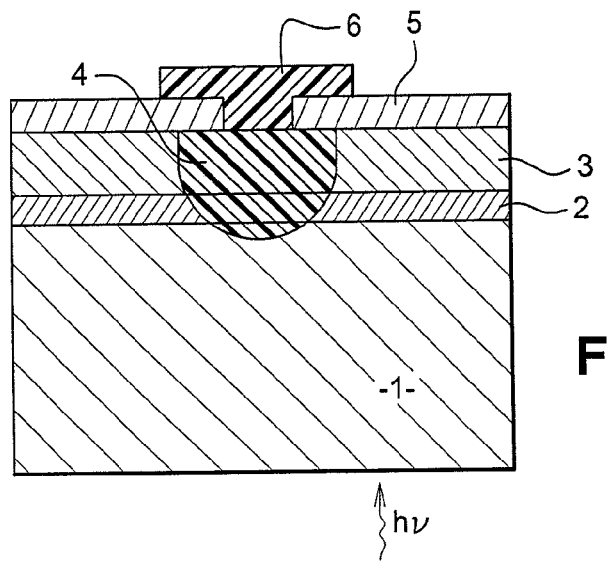
FIG. 1 is a schematic cross-sectional view of a photodiode prior to any etching.

FIG. 1 therefore shows a diode according to a first embodiment of the invention in which interaction layer 1 is designed to interact with incident photons of electromagnetic radiation such as infrared rays or visible light rays. Interaction layer 1 therefore preferably extends transversely or even at right angles to the direction of the incident photons that are to be detected.

In practice, layer 1 consists of a semiconductor material with a first conductivity type, for example an alloy of mercury, cadmium and tellurium having the formula $Hg_{1-x}Cd_xTe$. The thickness of the interaction layer, i.e. the height dimension in FIGS. 1 to 6, is selected depending on the wavelength of the radiation to be detected.

Thus, when short-wavelength infrared rays ($\lambda<3$ µm), medium-wavelength infrared rays ($3$ µm$<\lambda<6$ µm) or long-wavelength infrared rays ($\lambda>6$ µm) are to be detected, the thickness of interaction layer 1 may exceed 1 µm, 3 µm or 6 µm respectively.

Conventional deposition techniques are used to cover interaction layer 1 with collection layer 2 designed to collect the photocarriers released during interactions between incident rays and interaction layer 1. Like interaction layer 1, collection layer 2 consists of a semiconductor material such as an alloy of mercury, cadmium and tellurium having the formula $Hg_{1-x}Cd_xTe$ and the same conductivity type as interaction layer 1, but with a smaller band gap.

The thickness of collection layer 2 is sufficient to allow the flow of photocarriers originating from interaction layer 1. This thickness is reduced in order to minimize the dark current of the photodiode. Here, the thickness of layer 2 is 0.1 µm, but it can be thinner, for example 50 nm, or even less. In addition, the thinness of collection layer 2 makes it possible to limit charge-carrier generation or recombination phenomena in the depletion region of the p-n junction while also making it possible to limit the flow of these carriers due to the tunnel effect. Moreover, because of this reduced thickness, layer 2 only interacts slightly with interfering radiation such as thermal infrared rays.

A confinement layer 3 designed to confine photocarriers substantially in collection layer 2 is deposited on collection layer 2. Like layers 1 and 2, confinement layer 3 is made of a semiconductor material which has the first conductivity type, namely, in this case, p-type conductivity, with a band gap which is greater than that of collection layer 2. The thickness of confinement layer 3 is 0.2 µm to several µm. P-type conductivity is preferably chosen for layers 1, 2 and 3.

The photodiode also comprises a region 4 which extends transversely relative to the substantially parallel planes which form layers 1, 2 and 3. Thus, region 4 crosses layers 2 and 3 and therefore comes into electrical contact with them.

Figure 2:
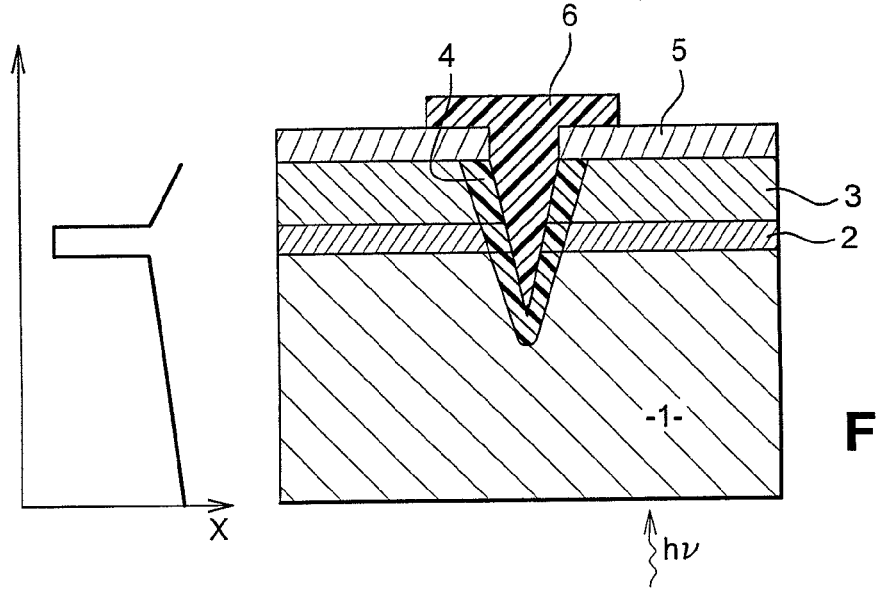
FIG. 2 is a schematic cross-sectional view of a photodiode in accordance with the invention. The diagram to the left of FIG. 2 represents the composition of the semiconductor materials that constitute the various layers of this photodiode. The energy levels of the band gaps can be deduced from this diagram.

In practice, in order to produce such a region 4, it is implanted or initially etched out hollow, as shown in FIG. 2, on the surface of confinement layer 3 to any depth, but ending in interaction layer 1. Then, in order to form a p-n junction with stacked layers 1, 2 and 3, region 4 is produced by type conversion during etching or by implantation or diffusion after etching. It has a conductivity type which is opposite to the conductivity type of layers 1, 2 and 3. In this case, region 4 therefore consists of an n-type doped semiconductor if layers 1, 2 and 3 are p-type.

Operations to produce region 4 are carried out conventionally and its shape is determined depending on the surface area of the p-n junction interface needed in order to collect photocarriers.

Also, region 4 does not necessarily penetrate into layer 1. Nevertheless, because of the inherent constraints of fabrication techniques, region 4 is made to penetrate slightly (as little as possible) into layer 1 in order to make certain that said region 4 passes through layer 2.

In the embodiments shown in FIGS. 1 and 2, the three layers 1, 2 and 3 are doped for a first conductivity type, in this case p-type, to a level of approximately $N_A=1.10^{16}$ cm$^{-3}$, where $N_A$ represents the concentration of acceptor states, whereas region 4, located at the bottom of the etching, has a doping level for the opposite conductivity type, i.e. n-type, of approximately $N_D=5.10^{16}$ cm$^{-3}$, where $N_D$ represents the concentration of donor states.

Confinement layer 3 is then covered with a first passivation layer 5 which is electrically neutral. Region 4 is placed in contact with an electrically conducting material intended to form a contact 6, for example a read contact, in order to transfer the electrical signals generated by the photocarriers collected in the p-n junction to the analysis circuit of the detector (not shown). The material which constitutes read plot 6 is in electrical contact with the material which forms region 4 but it is isolated from confinement layer 3 by passivation layer 5. This layer 5 may be produced before forming region 4. In the case of FIG. 2 the etched well is topped by the conducting material.

Also, interaction layer 1 advantageously has a composition gradient suitable for generating an electric field capable of moving the photocarriers from interaction layer 1 towards collection layer 2. Thus, when the photodiode operates with reverse bias, this electromotive field "pushes" photocarriers towards collection layer 2.

As shown by the diagram to the left of FIG. 2, for interaction layer 1, the fraction of cadmium x varies from 0.62 on the detection surface to 0.5 in collection layer 2. For collection layer 2, the fraction of cadmium x contained in collection layer 2 is 0.3 (x<0.5). This structure makes it possible to obtain detection with a low noise factor of approximately 1 (F=1).

Similarly, the composition of confinement layer 3 can be gradated so as to produce an electric field which more effectively confines the photocarriers in collection layer 2. Such a gradient can also be seen in the diagrams to the left of FIGS. 2, 3, 6 and 7.

Consequently, when the p-n junction is subjected to specific reverse bias, the photocarriers released by interactions between incident rays and the interaction layer are multiplied due to the avalanche effect because of the narrowness of the band gap of collection layer 2. In fact, with the same reverse bias voltage, multiplication of photocarriers in the depletion regions of the p-n junctions located between region 4 and each of layers 1 and 3 is negligible because of the larger width of the band gap of these layers. Consequently, the majority of photocarriers are multiplied by the p-n junction located between region 4 and collection layer 2.

This way, the photodiode according to the invention makes it possible to obtain high gain with a low reverse bias voltage along with insignificant dark current (due to the diffusion current) and insignificant tunnel currents because of the thinness of collection layer 2. Such currents are reduced by a factor of 10 to 1000 compared to a detector which has a thickness suitable for detecting radiation having energy close to the band gap of collection layer 2 (5 to 10 µm). Similarly, photocarrier generation and recombination phenomena in the depletion region are limited.

Consequently, and bearing in mind that the device operates with a low dark current, it is possible to increase the sensitivity of the detector and/or increase its operating temperature beyond those supported by photodiodes according to the prior art, and doing so without degrading the signal-to-noise ratio.

What is more, the construction of the photodiode according to the present invention is simplified compared with planar detectors according to the prior art because there is no need to produce a guard ring. In fact, the effects of curvature of the junction are limited because the maximum curvature of the junction is located in layer 1 with a large band gap when region 4 ends inside interaction layer 1.

In addition, because the photodiode has compact dimensions, its overall size and capacitance are reduced and this reduces the photodiode's response time. This therefore allows faster image acquisition than when using photodiodes according to the prior art.

Consequently, the avalanche photodiode in FIGS. 1 and 2 has the following advantages:
 high gain with low reverse bias voltage, even for detecting short-wavelength radiation;
 a low noise factor which typically equals 1;
 low dark current and/or high photodiode operating temperature;
 low sensitivity to thermal radiation emitted by warm objects;
 low capacitance.

Figure 3:
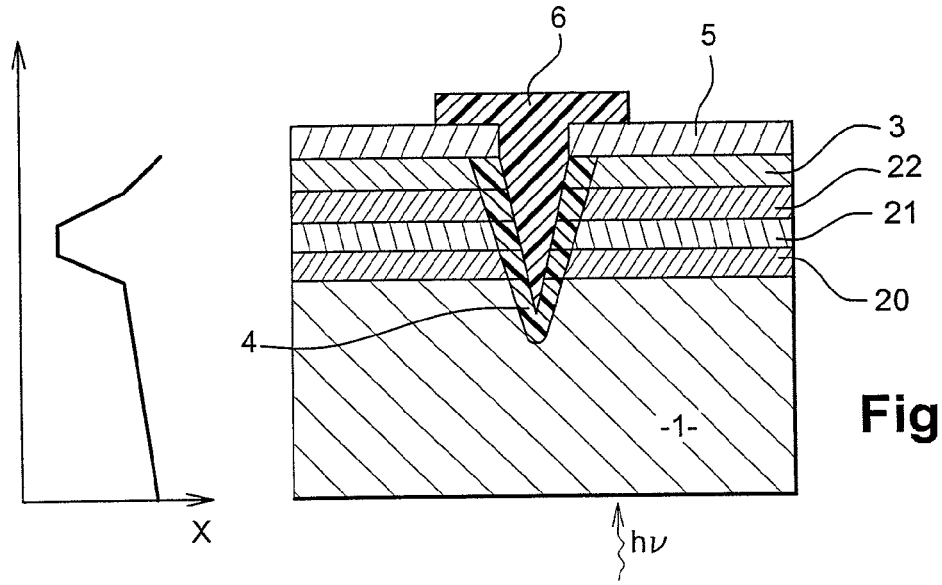
FIG. 3 is a schematic cross-sectional view of a photodiode which is a variation of the photodiode shown in FIG. 2. The diagram to the left of FIG. 3 represents the composition of the semiconductor materials that constitute the various layers of this photodiode. The energy levels of the band gaps can be deduced from this diagram.

FIG. 3 shows a photodiode which has a structure similar to that of the photodiode shown in FIG. 2. Nevertheless, it differs from the latter due to the presence of three layers 20, 21, 22 which are substituted instead of layer 2 in the photodiode in FIG. 2.

As shown in the diagram which represents the variation in the composition x of the semiconductor materials of the photodiode, layers 20 and 22 which sandwich layer 21 have a composition gradient. This gradated composition of layers 20 and 22 makes it possible to obtain a "soft" transition for photocarriers circulating from layer 1 to layer 22 which plays the same role as collection layer 2, namely to collect photocarriers.

In the case of FIG. 3, layers 20 to 22 are made as relatively thin layers in order, in particular, to minimize their sensitivity to certain radiation such as thermal infrared radiation. Adding "transition" layers 20 and 22 makes it possible to reduce the occurrence of defects at the heterojunctions represented by the interfaces of collection layer 21. Because of this, they improve the performance of the detector because they make it possible to reduce the dark current and increase the resistance to reverse bias.

Figure 4:
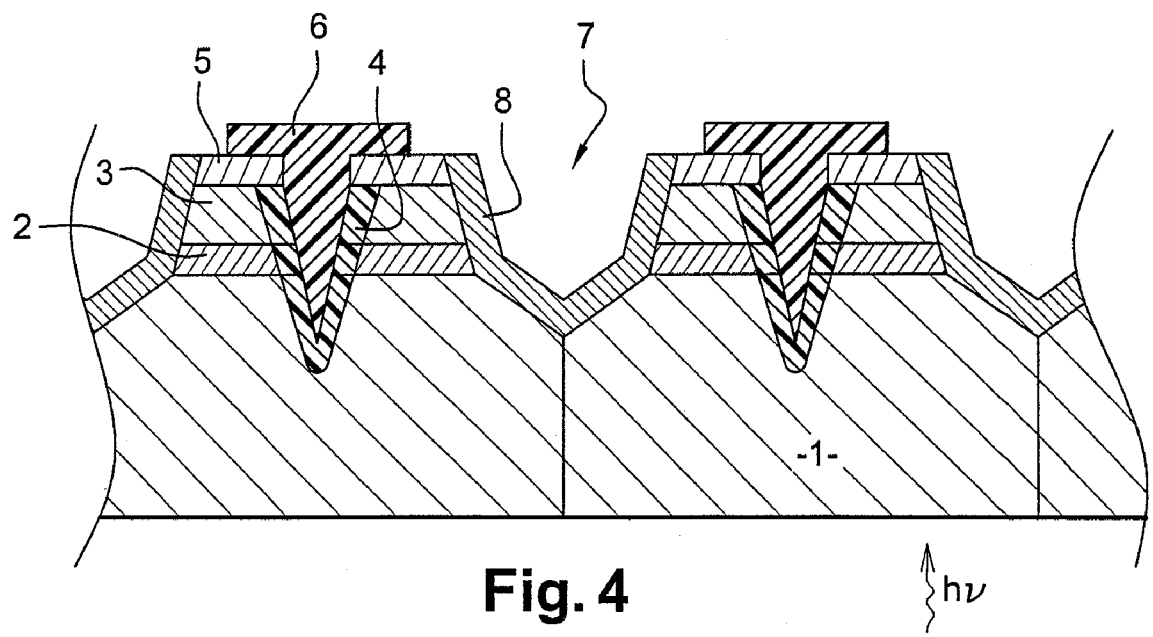
FIG. 4 is a schematic cross-sectional view of two juxtaposed photodiodes that are part of a detector in accordance with the invention.

FIG. 4 shows two juxtaposed photodiodes in another embodiment of the invention. The stacked layers of semiconductor materials here are similar to those shown in FIG. 2. Layers 1, 2 and 3, region 4 and layer 5 as well as contact 6 fulfil the same functions as the components which have the same reference numbers described in FIG. 2.

In addition, each photodiode is delineated by an area 7 which is free of material and extends depth wise over the entire height of collection layer 2 and confinement layer 3 and over part of the height of interaction layer 1. In area 7, the stack which constitutes the photodiode is covered by second passivation layer 8. Second passivation layer 8 can advantageously be made at the same time as first passivation layer 5. These two layers can even be a single identical layer.

Consequently, each photodiode of the detector shown in FIG. 4 is shaped like a "mesa" which protrudes above interaction layer 1 which is common to the adjacent photodiodes. Passivation layer 8 makes it possible to protect the flanks of the segments which form layers 2 and 3 and part of layer 1 of the photodiode stack. Besides this, second passivation layer 8 is capable of minimizing photocarrier recombination with defects located at interfaces between semiconductor layers 1, 2 and 3 and passivation layer 8.

This "mesa" structure of the detector in accordance with the invention makes it possible to reduce the diffusion surface which the photocarriers must cross before being collected by the p-n junction compared with the photodiodes shown in FIGS. 1 and 2. The photocarriers are thus "compelled" to converge towards the p-n junction at the level of region 4. Consequently, the response time of such a detector is reduced considerably. Obviously, this embodiment can be adapted to the photodiode shown in FIGS. 1 and 3.

Figure 5:
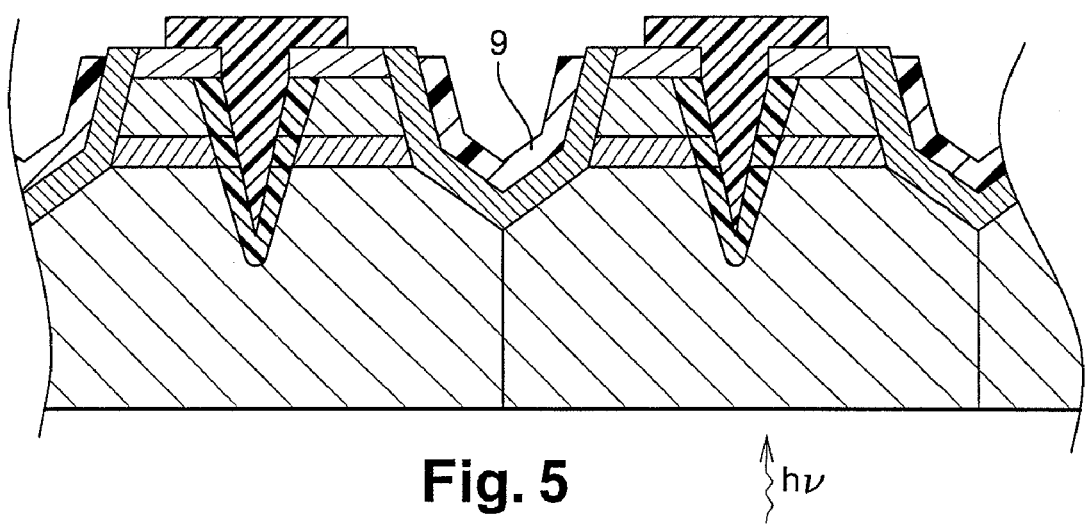
FIG. 5 is a schematic cross-sectional view of two juxtaposed photodiodes that are part of a detector which is a variation of the detector shown in FIG. 4.

FIG. 5 shows a variation of the detector shown in FIG. 4 in which second passivation layer 8 is covered in metallization layer 9. In the example in FIG. 5, metallization layer 9 covers the flanks and the bottom of the etching which defines the "mesas". Nevertheless, it is sufficient for metallization layer 9 to only cover passivation layer 8 opposite layers 2 and 3, in fact the bottom of area 7 can be free of any deposited metal.

During operation, the metallization layer which is common to all the photodiodes which make up the detector is brought to a bias voltage so as to accumulate charge carriers on the interfaces between semiconductor layers 1, 2 and 3 and second passivation layer 8. This accumulation of charge carriers makes it possible to generate an electric field capable of accelerating the photocarriers towards the p-n junction. Consequently, such an electric field makes it possible to reduce the response time of each photodiode, thereby improving the performance of the array detector.

The photodiodes described above can operate as a single sensor or may form an elementary sensor within a detection array.

Figure 6:
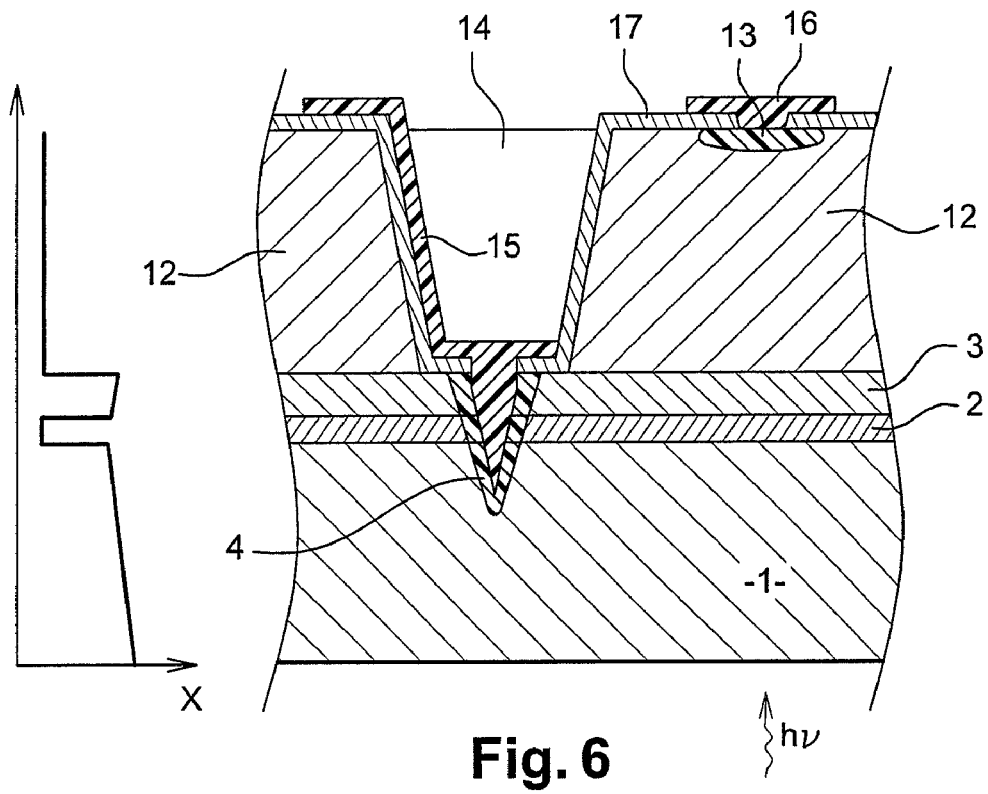
FIG. 6 is a schematic view of a photodiode of a dual spectrum detector with FIG. 7 showing a variation thereof.

FIG. 6 shows another embodiment of the invention, namely a dual spectrum detector capable of detecting two types of radiation having two separate energy spectra.

More precisely, FIG. 6 shows an elementary sensor of such a detector comprising a photodiode according to the invention and similar to that shown in FIG. 2. This avalanche photodiode, comprising semiconductor layers 1, 2 and 3, like that in FIG. 2, makes it possible to detect an infrared radiation band. The operation of this first photodiode is similar to that of the photodiode described in relation to FIG. 2 and so is not described again here.

A planar diode is superposed on avalanche diode 1-4. The characteristics of this planar photodiode are determined so as to detect a second spectral band which is separate from the first band, for example infrared rays having wavelengths greater than those detected by the avalanche photodiode.

Typically, the avalanche photodiode makes it possible to produce an amplified detector which is sensitive to wavelengths λ less than 3 μm and the planar diode forms a passive detector which is sensitive to thermal radiation having wavelengths greater than 3 μm. Operation of these amplified and passive detectors may exhibit temporal coherence.

In practice, an additional interaction layer 12 directly covers confinement layer 3 of the avalanche photodiode, i.e. it is not covered by the first passivation layer. Additional interaction layer 12 consists of a semiconductor material having the same conductivity type as layers 1 to 3, in this case p-type. Moreover, it has a band gap which is narrower than that of confinement layer 3. Thus, given the difference between the band gaps of layers 3 and 12, the photocarriers released during interaction between incident rays and additional interaction layer 12 do not, at the operating temperature of the detector, migrate through the heterojunction towards layer 3.

Locally, region 13 of additional interaction layer 12 is converted, i.e. its doping is modified so as to form a p-n junction, in order to collect the photocarriers released in layer 12. Conventionally, region 13 is located on the upper surface of layer 12. Region 13 is in contact with electrically conducting contact 16 which is capable of transferring the electrical signals produced by photocarriers to an analysis circuit.

Passivation layer 17 covers most of additional interaction layer 12 so as to protect it against mechanical or chemical damage.

Also, layer 12 has an area 14 which is free of material. Area 14 is obtained by etching down to the depth of confinement layer 3. It is then possible to deposit metallization layer 15 in the bottom and on at least one flank of etched area 14 so as to conduct the electrical signals produced by the photocarriers in the avalanche photodiode to electrically conducting contact 16. Electrically conducting metallization layer 15 is capable of transferring these electrical signals to an analysis circuit.

Thus, the avalanche photodiode and the planar diode are independently connected by means of metallization layers 15 and 16 which can then be connected to the analysis circuit via indium (In) bumps or by any other means of connection. The juxtaposition of such elementary sensors makes it possible to create an array detector for dual spectrum detection.

As explained previously in relation to FIGS. 1 to 5, the thinness of collection layer 2 makes it possible to limit its sensitivity to thermal radiation. For example, detection of a weak laser flux having a wavelength λ, of 1 μm to 3 μm is affected relatively little by thermal radiation because the latter is absorbed only very slightly by collection layer 2. One can thus make a distance measurement using laser reflectometry with temporal coherence with acquisition of a thermal image by the planar diode. This configuration is useful because the compositions of layers 2 and 12 can be chosen independently.

Figure 7:
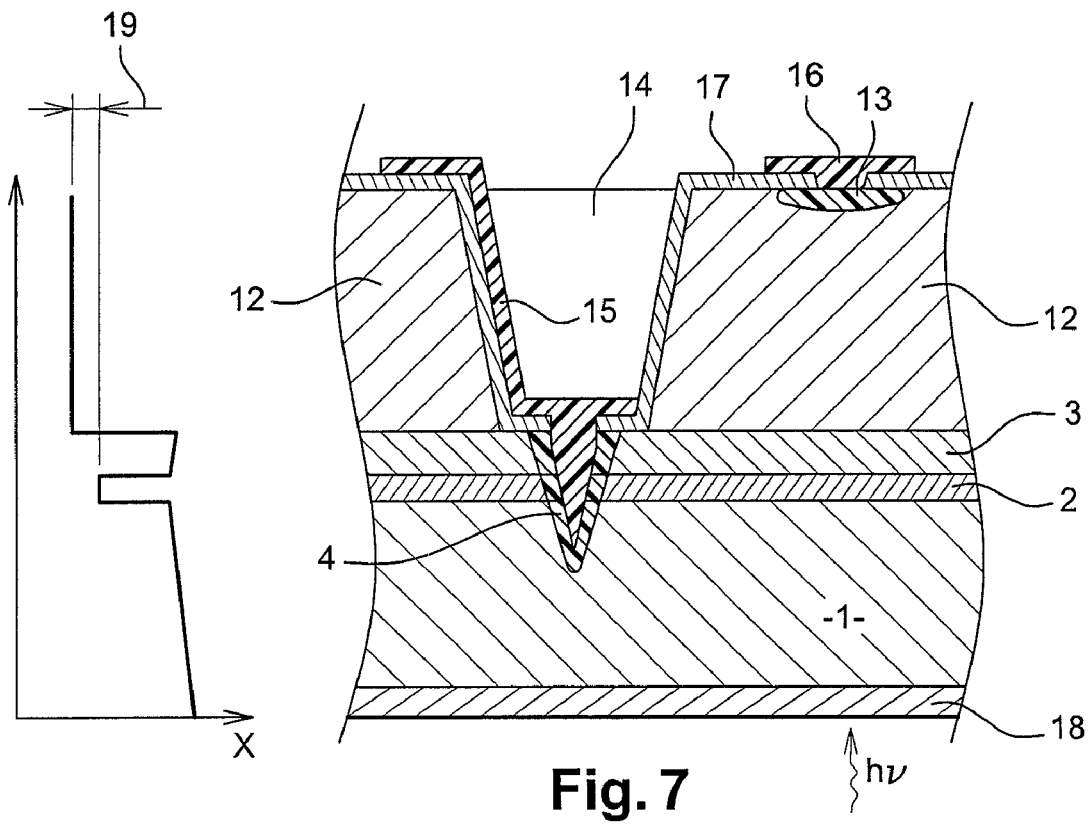

FIG. 7 shows a variation of FIG. 6 whereby dielectric layers which are transparent to the sensitive radiation to be detected can be placed on the rear face 18 of the detector so as to form an optical filter in order to reduce the absorption of thermal radiation even more. Such a filter then has the following characteristics:

high transmission, typically in excess of 90% for wavelengths below the cut-off wavelength of the avalanche diode $\lambda_{APD}$;

low transmission, typically less than 1% for the wavelength band between the cut-off wavelength of the avalanche diode $\lambda_{APD}$ and the cut-off wavelength $\lambda_{C2}$ of collection layer 2;

high transparency for wavelengths above the cut-off wavelength $\lambda_{C2}$ of collection layer 2.

In contrast to FIG. 6, use of this filter 18 requires interaction layer 12 to have a lower band-gap level 19 than that of interaction layer 2. Thus, the cut-off wavelength, i.e. the maximum detectable wavelength, of interaction layer 2 is less than the cut-off wavelength of interaction layer 12. This filter can obviously be adapted to suit all the variations of the photodiodes described above.

Figure 8:
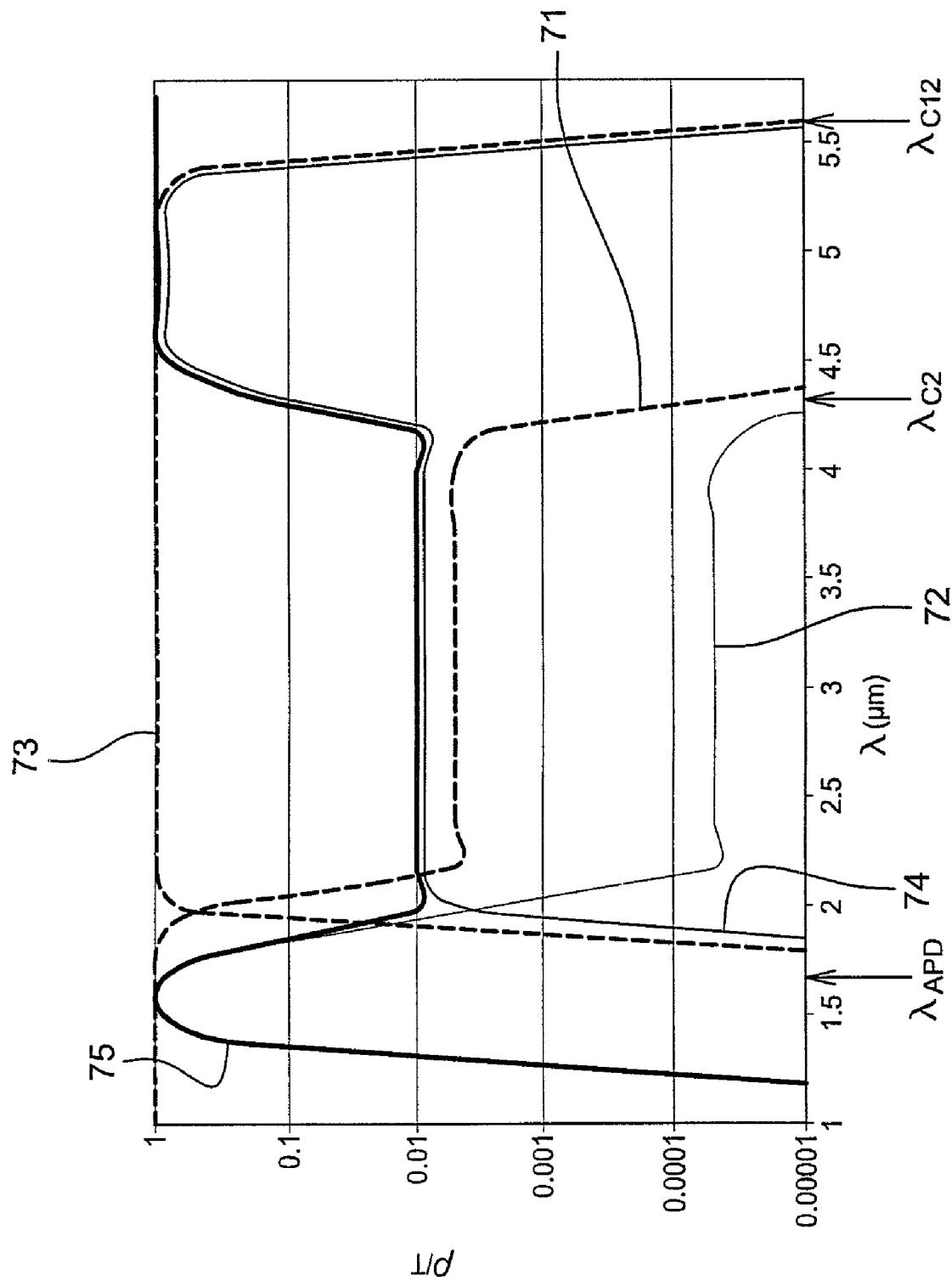
FIG. 8 shows the spectral response of the embodiment of the detector shown in FIG. 7.

FIG. 8 shows the sensitivity curve of the avalanche photodiode shown in FIG. 7 and the sensitivity curve of the planar diode superposed on it. The ordinate axis represents the quantum efficiency p of the diodes and the transmission T of the filter and the abscissa axis represents the wavelengths λ in question.

The avalanche photodiode which is the object of the invention, operating without a filter (curve 71) or with a filter (curve 72), is capable of detecting a first spectral band of wavelengths less than $\lambda_{APD}$. Using the filter makes it possible to reduce the detection level for wavelengths between $\lambda_{APD}$ and $\lambda_{C2}$ (the plateau of curve 72 is lower than the plateau of curve 71).

The so-called "thermal" planar photodiode "takes over" by detecting, without a filter (curve 73), a second spectral band between $\lambda_{APD}$ and $\lambda_{C12}$, the cut-off wavelength of layer 12.

The planar diode with a filter (curve 74) detects wavelengths from $\lambda_{C2}$ to $\lambda_{C12}$.

Curve 75 shows the transmission of the filter used.

Associating these two diodes makes it possible to form a dual spectrum elementary sensor, then a dual spectrum detector when several elementary sensors are juxtaposed in the form of an array.

The invention claimed is:

1. A photodiode designed to capture incident photons comprising a stack of at least three superposed layers of semiconductor materials having a first conductivity type, said stack comprising:
   an interaction layer designed to interact with incident photons so as to generate photocarriers;
   a collection layer to collect said photocarriers;
   a confinement layer designed to confine said photocarriers in said collection layer;
   said collection layer having a band gap less than the band gaps of said interaction layer and said confinement layer, and
   wherein said collection layer is thinner than said confinement layer,
   said photodiode also comprising a region which extends transversely relative to the planes of said collection and confinement layers, said region being in contact with and completely crossing said collection layer and said confinement layer, and having a conductivity type opposite to said first conductivity type so as to form a p-n junction region with said stack.

2. A photodiode as claimed in claim 1, wherein said collection layer is thinner than said interaction layer.

3. A photodiode as claimed in claim 1, wherein said collection layer has a thickness less than 0.5 µm whereas said interaction layer has a thickness greater than 1 µm.

4. A photodiode as claimed in claim 1, wherein the material which constitutes said interaction layer has a composition gradient.

5. A photodiode as claimed in claim 1, wherein the confinement layer is covered in a first passivation layer.

6. A photodiode as claimed in claim 5, wherein the photodiode is delineated by an area which is free of material and said area extends depth wise over the entire height of the collection layer and confinement layer and over part of the height of said interaction layer, that part of said stack located in said area being covered in a second passivation layer.

7. A photodiode as claimed in claim 6, wherein the second passivation layer is covered by a metallisation layer.

8. A photodiode as claimed in claim 6, wherein the passivation layers are a single identical layer.

9. A photodiode as claimed in claim 1, wherein a read contact is formed so that the read contact is in contact with said region and is capable of transferring the electrical signals produced by photocarriers to an analysis circuit.

10. A photodiode as claimed in claim 1, wherein said region extends transversely relative to the planes of said collection and confinement layers starting from a hollow conical shape in said interaction layer.

11. A photodiode as claimed in claim 1, wherein the first conductivity type is p-type.

12. A photodiode as claimed in claim 1, wherein the interaction layer and the collection layer consist of an alloy of mercury, cadmium and tellurium having the formula $Hg_{1-x}Cd_xTe$ and in that fraction x is selected as 0.1 to 0.5 for the collection layer.

13. A photodiode as claimed in claim 1, wherein the interaction layer and the collection layer consist of an alloy of mercury, cadmium and tellurium having the formula $Hg_{1-x}Cd_xTe$ and in that fraction x is selected as 0.1 to 1 for the interaction layer.

14. A photodiode as claimed in claim 1, wherein the collection layer comprises a stack of superposed layers made of semiconductor materials with a central layer having a band gap which is less than the band gaps of peripheral layers.

15. An electromagnetic radiation detector comprising at least two juxtaposed diodes as claimed in claim 1.

16. A dual spectrum electromagnetic radiation detector, comprising at least one photodiode as claimed in claim 1 designed to capture photons in a first energy spectrum having wavelengths less than the cut-off wavelength of the photodiode ($\lambda < \lambda_{APD}$) on which there is a planar diode comprising an absorption layer designed to capture photons in a second energy spectrum having wavelengths between the cut-off wavelength of the photodiode and the cut-off wavelength of said absorption layer ($\lambda_{APD} < \lambda < \lambda_{C12}$) as well as a second p-n junction region which is connected to an electrically conducting contact, said absorption layer having a well which communicates with said first p-n junction region, a passivation layer covering said absorption layer and a metallisation layer covering said first p-n junction region and said passivation layer over part of said well; said contact and said metallisation layer being capable of conducting electrical signals from the photodiode to an analysis circuit.

17. A dual spectrum electromagnetic radiation detector as claimed in claim 16, further comprising a layer located on said interaction layer on its face opposite to that which receives said collection layer, said layer not transmitting or only slightly transmitting photons having a wavelength λ between the cut-off wavelength of the photodiode and the cut-off wavelength of said collection layer ($\lambda_{APD} < \lambda < \lambda_{C2}$) but transmitting photons having a wavelength λ which is less than the cut-off wavelength of the photodiode $\lambda_{APD}$ or having a wavelength λ which is greater than the cut-off wavelength of said collection layer $\lambda_{C2}$.

18. A photodiode designed to capture incident photons comprising a stack of at least three superposed layers of semiconductor materials having a first conductivity type, said stack comprising:
   an interaction layer designed to interact with incident photons so as to generate photocarriers;
   a collection layer to collect said photocarriers;
   a confinement layer designed to confine said photocarriers in said collection layer;
   said collection layer having a band gap less than the band gaps of said interaction layer and said confinement layer, and
   wherein said collection layer is thinner than said confinement layer,
   said photodiode also comprising a region which extends transversely relative to the planes of said collection and confinement layers, said region being in contact with said collection layer and said confinement layer, and having a conductivity type opposite to said first conductivity type so as to form a p-n junction with said stack, and
   wherein said region extends partially into said interaction layer.

* * * * *